(12) United States Patent
Yang et al.

(10) Patent No.: US 8,811,101 B2
(45) Date of Patent: Aug. 19, 2014

(54) SIP SEMICONDUCTOR SYSTEM

(75) Inventors: Hyung Gyun Yang, Icheon-si (KR);
Hyung Dong Lee, Icheon-si (KR); Yong Kee Kwon, Icheon-si (KR); Young Suk Moon, Icheon-si (KR); Sung Wook Kim, Icheon-si (KR); Keun Hyung Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 363 days.

(21) Appl. No.: 13/399,643

(22) Filed: Feb. 17, 2012

(65) Prior Publication Data

US 2012/0213022 A1   Aug. 23, 2012

(30) Foreign Application Priority Data

Feb. 21, 2011 (KR) .................. 10-2011-0015176
Jun. 22, 2011 (KR) .................. 10-2011-0060826

(51) Int. Cl.
*G11C 7/00* (2006.01)
*G11C 29/00* (2006.01)

(52) U.S. Cl.
USPC .............. 365/201; 365/225.7; 365/185.09; 365/189.03

(58) Field of Classification Search
CPC ...... G11C 29/00; G11C 29/04; G11C 29/027; G11C 29/12; G11C 2229/763
USPC .............. 365/201, 225.7, 185.09, 189.03
See application file for complete search history.

(56) References Cited

U.S. PATENT DOCUMENTS

| 7,937,631 | B2 | 5/2011 | Vogelsang | |
| 2003/0099143 | A1* | 5/2003 | Fujioka et al. | 365/201 |
| 2008/0065929 | A1* | 3/2008 | Nadeau-Dostie et al. | 714/5 |
| 2009/0063919 | A1* | 3/2009 | Whetsel | 714/726 |
| 2010/0020614 | A1* | 1/2010 | Tu et al. | 365/185.11 |

OTHER PUBLICATIONS

Keunhyung Kim et al., Implementation of Low Cost NAND Test using Embedded Controller, Nov. 2010.

* cited by examiner

*Primary Examiner* — Toan Le
(74) *Attorney, Agent, or Firm* — William Park & Associates Patent Ltd.

(57) ABSTRACT

A system in package (SIP) semiconductor system includes a memory device, a controller, a first input/output terminal, a test control unit, and a second input/output terminal. The controller communicates with the memory device. The first input/output terminal performs communication between the controller and a device external to the SIP semiconductor system. The test control unit controls a predetermined test mode of the memory device. The second input/output terminal performs communication between the test control unit and at least the device external to the SIP semiconductor system.

22 Claims, 2 Drawing Sheets

FIG.3

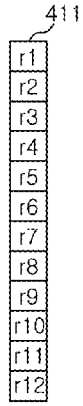

| Test mode | Register | Register bit number | Recording signal subject | Description |
|---|---|---|---|---|
| Available fuse search operation | Fuse search start (r1) | 1 | Second input/output terminal | Start operation of identifying number of available electrical fuses for repair |
| | Available fuse information (r2~r5) | 4 | Memory device | Available electrical fuse=1, unavailable electrical fuse=0 |
| | Fuse search end (r6) | 1 | Memory device | Fuse search end signal, 1=end, 0=non-end, if r1=1, |
| Rupture operation | Rupture start (r7) | 1 | Second input/output terminal | Start rupture operation for object fuse |
| | Rupture object fuse information (r8~r11) | 4 | Second input/output terminal | Electrical fuse subjected to rupture operation=1, electrical fuse not subjected to rupture operation=0 |
| | Rupture end (r12) | 1 | Memory device | 1=rupture end, 0=rupture non-end, if r7=1, reset |

SIP SEMICONDUCTOR SYSTEM

CROSS-REFERENCES TO RELATED APPLICATION

The present application claims priority under 35 U.S.C. §119(a) to Korean application number 10-2011-0015176 filed on Feb. 21, 2011 and Korean application number 10-2011-0060826, filed on Jun. 22, 2011 in the Korean Intellectual Property Office, which is incorporated by reference in its entirety.

BACKGROUND

1. Technical Field

The present invention relates to a semiconductor system, and more particularly, to a system in package (SIP) semiconductor system in which a memory device and a controller are in one package.

2. Related Art

As semiconductor devices are integrated, a system in package (SIP) technology is used, in which a memory device and a controller are configured in one package.

A SIP semiconductor system configured using the SIP technology can have superior characteristics in terms of noise and operation stability compared to a semiconductor device configured using a heterogeneous package technology.

In the SIP semiconductor system configured using the SIP technology, all input/output terminals accessing a memory device from the outside of a package are generally connected to a controller in the package, and hence there exists no terminal capable of directly accessing the memory device from the outside of the package. Therefore, the SIP semiconductor system cannot perform a probe test and repair operation performed in the semiconductor device using the heterogeneous package technology.

In order to solve such a problem, the SIP semiconductor system performs a test of an internal memory device through an internal controller, and a design for test (DFT) such as a memory built-in self test (MBIST) or scan test is used to perform the test.

In order to repair the memory device of the SIP semiconductor system based on a test result obtained through the DFT, a redundancy analysis (RA) is required to allow optimal repair to be performed by analyzing the test result. The RA has a relatively complicated configuration, and the area and cost of the package or memory device is increased by implementing the configuration as an internal logic circuit.

SUMMARY

A SIP semiconductor system capable of testing an internal memory device using less area and cost is described.

In one embodiment of the present invention, a SIP semiconductor system includes a memory device, a controller configured to communicate with the memory device, a first input/output terminal configured to perform communication between the controller and a device external to the SIP semiconductor system, a test control unit configured to control a predetermined test mode of the memory device, and a second input/output terminal configured to perform communication between the test control unit and at least the device external to the SIP semiconductor system.

In another embodiment of the present invention, a SIP semiconductor system includes a memory device configured to include electrical fuses for restoring a defective storage element, a test control unit configured to control a predetermined test mode of the memory device, and an input/output terminal configured to perform communication between the test control unit and a device external to the SIP semiconductor system. In the SIP semiconductor system the test control unit may use an IEEE standard interface, store a code with a plurality of bits in an internal register according to an input signal received through the input/output terminal, and store a test result received from the memory device in the internal register. The memory device may perform the predetermined test mode according to values stored in the internal register.

In still another embodiment of the present invention, a SIP semiconductor system includes a test access port, a register configured to be connected to the test access port, and output a rupture start signal and a rupture object fuse information signal during a repair operation, and a fuse unit configured to rupture a fuse corresponding to the rupture object fuse information signal in response to the rupture start signal and the rupture object fuse information signal.

BRIEF DESCRIPTION OF THE DRAWINGS

Features, aspects, and embodiments are described in conjunction with the attached drawings:

FIG. 3 illustrates one exemplary embodiment of a predetermined test mode operation based on settings of an internal register illustrated in FIG. 2.

DETAILED DESCRIPTION

A SIP semiconductor system according to the present invention will be described below with reference to the accompanying drawings through exemplary embodiments.

The SIP semiconductor system according to an embodiment of the present invention includes an input/output terminal for directly testing a memory device of the SIP semiconductor system so that it may be possible to test and repair the memory device of the SIP semiconductor system.

Furthermore, in the SIP semiconductor system according to an embodiment of the present invention, the input/output terminal is configured according to the IEEE 1149.1 Standard so that it is possible to facilitate implementing a test operation of the SIP semiconductor system and loading test equipment of the SIP semiconductor system.

Figure 1:
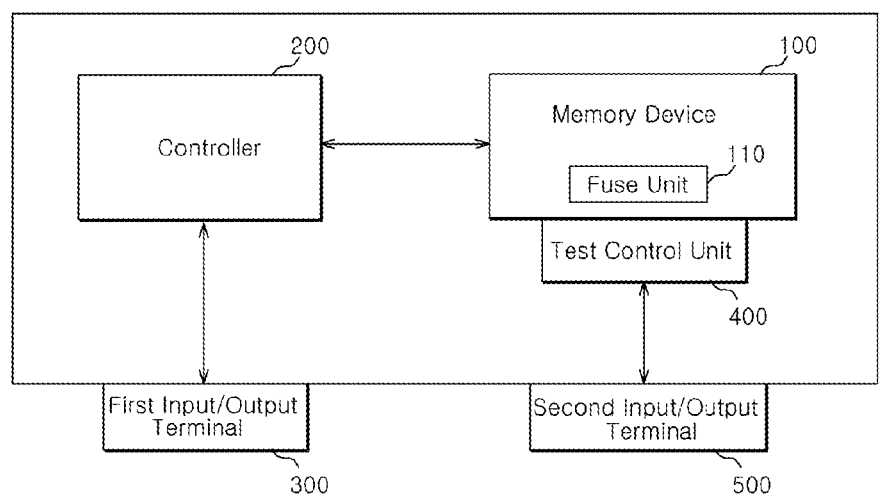
FIG. 1 is an exemplary block diagram of a SIP semiconductor system according to one embodiment of the invention.

FIG. 1 is an exemplary block diagram of a SIP semiconductor system according to one embodiment of the invention.

As illustrated in FIG. 1, the SIP semiconductor system can be configured to include a memory device 100, a controller 200, a first input/output terminal 300, a test control unit 400, and a second input/output terminal 500.

The memory device 100 includes a plurality of storage elements for storing data. The configuration of the memory device 100 is not particularly limited. As an example, the memory device 100 can be configured to include a single memory chip or can be configured to include a plurality of memory chips stacked using through silicon via (TSV). As another example, the memory device 100 can be configured as a volatile memory device such as a DRAM or can be configured as a non-volatile memory device such as a flash memory.

The controller 200 controls the memory device 100. The controller 200 can be configured to include a processor such as a general central processing unit (CPU) or graphic processing unit (GPU).

The first input/output terminal 300 is an input/output terminal for communication between the outside of the SIP semiconductor system and the controller 200. The first input/output terminal 300 can be configured to include an input/output terminal of a general SIP semiconductor system.

The controller 200 communicates with devices external to the SIP semiconductor system through the first input/output terminal 300, and controls the memory device 100.

The test control unit 400 controls a predetermined test mode of the memory device 100.

The test control unit 400 controls the memory device 100 to perform various predetermined test modes (e.g., a repair operation). The predetermined test mode of the test control unit 400 includes a variety of tests. The test control unit 400 can include a plurality of algorithms for performing the predetermined test mode. The test of the memory device 100, performed by the test control unit 400 includes a voltage test (AC or DC test), a functional test of semiconductor logic, a memory cell test, and the like. However, the present invention is not limited thereto. Particularly, since memory devices such as DRAMs or flash memories include a large number of memory cells, much time may be taken to perform the memory cell test for finding a defective memory cell. Thus, the memory cell test performed through the test control unit 400 can decrease test time and increase test efficiency as compared with that performed through external test equipment.

The test control unit 400 directly controls the memory device 100, and can communicate with devices external to the SIP semiconductor system through the second input/output terminal 500. Thus, the test control unit 400 may not need to communicate with the controller 200 for some of its functionality.

For example, when the predetermined test mode is a repair operation, the SIP semiconductor system according to this embodiment can repair a defective storage element of the memory device 100. Alternatively, the SIP semiconductor system according to this embodiment can repair a defective TSV in the memory device 100 including the plurality of memory chips stacked using the TSV.

More specifically, the memory device 100 further includes a fuse unit 110 having an electrical fuse (E-fuse) for restoring a defective storage element or defective TSV. The memory device 100 can be configured to perform a rupture operation on the E-fuse by performing the predetermined test mode.

The test control unit 400 can be configured separately from the memory device in the inside of the SIP semiconductor system. The test control unit 400 can be configured to be included in the memory device 100. It will be apparent that the present invention is not limited to where the test control unit 400 is positioned in the SIP semiconductor system.

As an example, when the memory device 100 is configured to include a plurality of memory chips, the test control unit 400 can be included in each of the plurality of memory chips. The memory device 100 configured so that the test control unit 400 included in each of the plurality of memory chips can perform the predetermined test mode in the state where the memory device 100 is connected in parallel to the plurality of memory chips.

As another example, when the memory device 100 is configured to include a plurality of memory chips stacked using the TSV, the test control unit 400 can be included in one of the plurality of memory chips. Among the plurality of memory chips, the memory chip with the test control unit 400 may be a memory chip (e.g., a master chip) communicating with the controller 200.

The second input/output terminal 500 is an input/output terminal for communication between the test control unit 400 and the outside of the SIP semiconductor system.

The SIP semiconductor system configured as described above can control the memory device by communicating with the controller 200 through the first input/output terminal 300. The SIP semiconductor system can control the memory device 100 to perform the predetermined test mode by communicating with the test control unit 400 through the second input/output terminal 500.

Thus, the SIP semiconductor system can perform the test of the memory device 100 without passing through the controller 200.

The test control unit 400 can be configured using IEEE 1149.1.

The IEEE 1149.1 (JTAG Boundary Scan test) is a serial standard interface used as a standard in communication between a SIP semiconductor system and a device external (e.g., a system board) to the SIP semiconductor system.

The test control unit 400 configured using the IEEE 1149.1 has advantages as follows.

The IEEE 1149.1 is a standardized interface, and its configuration is relatively simple. Thus, it is easy to design the test control unit 400. Further, it is unnecessary to have a complicated configuration like the related art DFT using an RA algorithm.

The IEEE 1149.1 is an interface used as a standard in communication between the related art SIP semiconductor system and the system board. Thus, the test can be performed by loading the SIP semiconductor system according to an embodiment of the present invention onto the system board without configuring a separate logic on the system board.

The SIP semiconductor system according to this embodiment is configured using the IEEE 1149.1 so as to have characteristics suitable for communication with the system board.

The IEEE 1149.1 is frequently used in current test communication between the system board and the SIP semiconductor system, but the test control unit 400 can be differently configured depending on a change in IEEE standard interface. That is, the test control unit 400 can be configured not only using the IEEE 1149.1 but also using the IEEE standard interface. When the test control unit 400 is configured using the IEEE 1149.1, the second input/output terminal 500 is preferably configured as a test access port for supporting the IEEE 1149.1.

The test access port of the IEEE 1149.1 can be configured to include TDI, TDO, TMS, TCK, and TRST.

The TDI is a test data input terminal, and the TDO is a test data output terminal. The TMS is a test mode select terminal, and the TCK is a test clock-signal terminal. The TRST is a test reset terminal.

The IEEE 1149.1 is configured to perform a recording operation for an internal register under communication of the test access port. One embodiment for setting the internal register will be described later.

Figure 2:
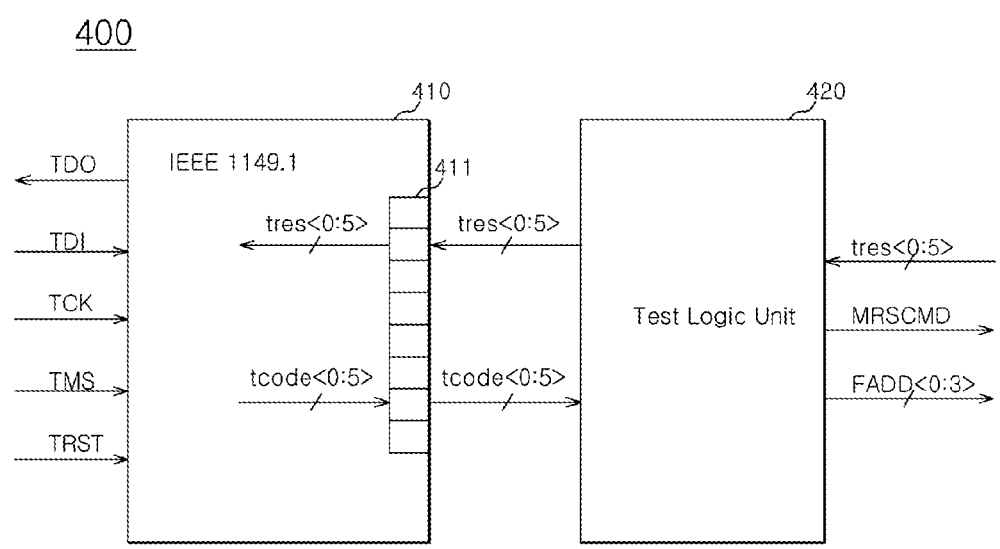
FIG. 2 is a detailed block diagram of an exemplary test control unit illustrated in FIG. 1.

FIG. 2 is a detailed block diagram of the test control unit 400 illustrated in FIG. 1.

The test control unit 400 can be configured to include a test register unit 410 and a test logic unit 420.

The test register unit 410 generates a test code tcode<0:5> in an internal register 411 according to an input signal TDI, TCK, TMS or TRST received from the second input/output terminal 500.

The test register unit 410 can be configured using, for example, the IEEE 1149.1.

The test code tcode<0:5> can be recorded in the internal register 411 by the input signal TDI, TCK, TMS or TRST received from the second input/output terminal 500. In addition, the test code tcode<0:5> can be recorded in the internal register 411 by a test result tres<0:5> generated as the memory device 100 performs a test mode. The embodiment for setting the internal register will be described later.

The test logic unit 420 generates test control signals MRSCMD and FADD<0:3> according to the test code tcode<0:5> stored in the internal register 411, and provides the generated test control signals to the memory device 100.

For example, the test logic unit 420 can generate the test control signal MRSCMD so that the memory device 100 starts a repair operation in response to the test code tcode<1>. In this case, the test control signal MRSCMD can be configured to include a mode register setting signal.

The test logic unit 420 can also generate the test control signal FADD<0:3> so that the semiconductor device 100 performs the repair operation in response to the test code tcode<2:5> stored in the internal register 411. In this case, the test control signal FADD<0:3> can be configured to include a fuse address signal.

The memory device 100 can perform the predetermined test mode (e.g., a repair operation such as an available fuse search operation or rupture operation) in response to the test control signals MRSCMD and FADD<0:3>.

The test logic unit 420 can be configured to receive the test result tres<0:5> from the memory device 100 and provide the received test result to the test register unit 410. In this case, the test register unit 410 can be configured to record the test result tres<0:5> in the internal register 411 and output the test result tres<0:5> recorded in the internal register 411 to the outside through the second input/output terminal via TDO using the IEEE 1149.1.

Although it has been illustrated in FIG. 2 that the test code tcode<0:5> and the test result tres<0:5> are 6-bit signals, the present invention is not limited thereto.

FIG. 3 illustrates one embodiment of the predetermined test mode operation based on settings of the internal register 411 illustrated in FIG. 2.

It is assumed that the memory device 100 has an electrical fuse for restoring a defective storage element.

The predetermined test mode operation can be configured to include a repair operation such as an available fuse search operation or rupture operation.

The available fuse search operation is an operation of searching for an available electrical fuse among electrical fuses provided to the memory device 100.

The rupture operation is an operation of rupturing the available electrical fuse according to a test code.

In order to perform the available fuse search operation, the internal register 411 can include, for example, a fuse search start register r1, available fuse information registers r2 to r5, and a fuse search end register r6.

The fuse search start register r1 determines whether the operation of searching the available electrical fuse is to start for the purpose of repair. Thus, the fuse search start register r1 can be configured to have a single bit. A value of the fuse search start register r1 is recorded by the input signal inputted from the second input/output terminal 500.

The test logic unit 420 illustrated in FIG. 2 receives the value of the fuse search start register r1 as the test code tcode<0>. Accordingly, the test control signal MRSCMD can be generated so that the memory device 100 performs the available fuse search operation. For example, when the value of the fuse search start register r1 is 1, the test logic unit 420 can generate the test control signal MRSCMD so that the memory device 100 performs the available fuse search operation.

The available fuse information registers r2 to r5 are registers in which information on available electrical fuses is recorded. Values of the available fuse information registers r2 to r5 are recorded according to the test result tres<0:4> inputted from the memory device 100. In the available fuse search operation, the test result tres<0:4> can include information on available electrical fuses and a fuse search end signal.

The available fuse information registers r2 to r5 are preferably configured to have a storage space of bits (4 bits) respectively corresponding to electrical fuses (e.g., 4) included in the memory device 100. For example, the available fuse information registers r2 to r5 can be configured to have a storage space of 4 bits respectively corresponding to four electrical fuses.

If the memory device 100 outputs the information on available electrical fuses as the test result tres<1:4> through the available fuse search operation, the values of the available fuse information registers r2 to r5, respectively corresponding to the available electrical fuses are recorded as 1. For unavailable fuses, the values of the available fuse information registers r2 to r5 respectively corresponding to unavailable electrical fuses are recorded as 0.

The fuse search end register r6 is a register in which the end of the available fuse search operation is recorded. Thus, the fuse search end register r6 can be configured to have a single bit. A value of the fuse search end register r6 is recorded by the search result inputted from the memory device 100.

For example, if the memory device 100 outputs an available search operation end signal as the test result tres<0> through the available fuse search operation, the value of the fuse search end register r6 is changed from 0 to 1. If the value of the fuse search start register r1 is set to 1, the value of the fuse search end register r6 is reset to 0.

In order to perform the rupture operation, the internal register 411 can include a rupture start register r7, rupture object fuse information registers r8 to r11, and a rupture end register r12.

The rupture start register r7 determines whether the operation of rupturing the electrical fuse is started for the purpose of repair. Thus, the rupture start register r7 can be configured to have a single bit. A value of the rupture start register r7 is recorded by the input signal TDI, TMS, TCK, or TRST inputted from the second input/output terminal 500.

The test logic unit 420 illustrated in FIG. 2 receives the value of the rupture register r7 as the test code tcode<1>. Accordingly, the test control signal MRSCMD can be generated so that the memory device 100 starts the operation of rupturing a corresponding electrical fuse. For example, when the value of the rupture register value r7 is 1, the test logic unit 420 can generate the test control signal MRSCMD so that the memory device 100 performs the operation of rupturing the corresponding electrical fuse.

The rupture object fuse information registers r8 to r11 are registers in which addresses of electrical fuses subjected to the rupture operation are recorded. Values of the rupture object fuse information registers r8 to r11 are recorded by the input signal TDI, TMS, TCK, or TRST inputted from the second input/output terminal 500.

The rupture object fuse information registers r8 to r11 is preferably configured to have a storage space of bits (4 bits) respectively corresponding to electrical fuses (e.g., 4) included in the memory device 100. For example, the rupture object fuse information registers r8 to r11 can be configured to have a storage space of 4 bits respectively corresponding to four electrical fuses.

The values of the rupture object fuse information registers r8 to r11, respectively corresponding to electrical fuses subjected to the rupture operation, are recorded as 1. On the contrary, the values of the rupture object fuse information registers r8 to r11, respectively corresponding to electrical fuses not subjected to the rupture operation, are recorded as 0.

The test logic unit 420 receives the values of the fuse information registers r8 to r11 as the test code tcode<2:5>. Accordingly, the test control signal FADD<0:3> can be generated so that the memory device 100 ruptures a corresponding electrical fuse.

The rupture end register r12 is a register in which the end of the rupture operation is recorded. Thus, the rupture end register r12 can be configured to have a single bit. A value of the rupture end register r12 is recorded by the search result inputted from the memory device 100.

For example, if the memory device 100 outputs an available fuse search operation end signal as the test result tres<5> through the available fuse search operation, the value of the rupture end register r12 is changed from 0 to 1. If the value of the rupture register r7 is set to 1, the value of the rupture end register r12 is reset to 0.

While certain embodiments have been described above, it will be understood to those skilled in the art that the embodiments described are by way of example only. Accordingly, the SIP semiconductor system described herein should not be limited based on the described embodiments. Rather, the SIP semiconductor system described herein should only be limited in light of the claims that follow when taken in conjunction with the above description and accompanying drawings.

What is claimed is:

1. A system in package (SIP) semiconductor system, comprising:
    a controller configured to communicate with a memory device;
    a first input/output terminal configured to perform communication between the controller and a device external to the SIP semiconductor system;
    a test control unit configured to control a predetermined test mode of the memory device; and
    a second input/output terminal configured to perform communication between the test control unit and at least the device external to the SIP semiconductor system.

2. The SIP semiconductor system according to claim 1, wherein the test control unit is configured using an IEEE standard interface.

3. The SIP semiconductor system according to claim 1, wherein the test control unit comprises:
    a test register unit configured to generate a test code in an internal register according to an input signal received from the second input/output terminal; and
    a test logic unit configured to generate a test control signal according to the test code and provide the generated test control signal to the memory device.

4. The SIP semiconductor system according to claim 3, wherein the predetermined test mode comprises a repair operation for the memory device, the test logic unit generates a mode register setting command for performing the repair operation according to one or more bits of the test code, and the test logic unit generates a fuse address signal for performing the repair operation according to another or more bits of the test code.

5. The SIP semiconductor system according to claim 4, wherein the test logic unit receives a repair end signal from the memory device and provides the received repair end signal to the test register unit, and the test register unit records the repair end signal in the internal register, and outputs the repair end signal recorded in the internal register to the external device through the second input/output terminal.

6. The SIP semiconductor system according to claim 1, wherein the memory device comprises a plurality of memory chips.

7. The SIP semiconductor system according to claim 6, wherein one of the plurality of memory chips communicates with the controller, and the one memory chip comprises the test control unit.

8. The SIP semiconductor system according to claim 1, wherein the memory device has an electrical fuse for restoring a defective storage element, and the test mode comprises a rupture operation for the electrical fuse.

9. The SIP semiconductor system according to claim 1, wherein the predetermined test mode comprises a test mode in which an algorithm for performing a test of memory cells provided to the memory device is executed.

10. A SIP semiconductor system, comprising:
    a memory device comprising electrical fuses for restoring a defective storage element;
    a test control unit configured to control a predetermined test mode of the memory device; and
    an input/output terminal configured to perform communication between the test control unit and a device external to the SIP semiconductor system, wherein:
    the test control unit uses an IEEE standard interface, stores a code with a plurality of bits in an internal register according to an input signal received through the input/output terminal, and stores a test result received from the memory device in the internal register; and
    the memory device performs the predetermined test mode according to values stored in the internal register.

11. The SIP semiconductor system according to claim 10, wherein the predetermined test mode comprises an available fuse search operation and a rupture operation, wherein the available fuse search operation is an operation of searching available electrical fuses among the electrical fuses provided to the memory device, and the rupture operation is an operation of rupturing the electrical fuses according to the values stored in the internal register.

12. The SIP semiconductor system according to claim 11, wherein the values stored in the internal register comprise a register value for determining whether the available fuse search operation is to start or has started, a register value in which it is recorded that the available fuse search operation has ended, and a register value in which information on the searched available electrical fuses is recorded, for the purposed of the available fuse search operation.

13. The SIP semiconductor system according to claim 11, wherein the values stored in the internal register comprise a register value for determining whether the rupture operation is to start or has started, a register value in which it is recorded that the rupture operation has ended, and a register value in which an address of the electrical fuse to be ruptured is recorded, for the purpose of the rupture operation.

14. The SIP semiconductor system according to claim 11, wherein a defective storage element is repaired through the rupture operation of the electrical fuse.

15. The SIP semiconductor system according to claim 11, wherein the memory device comprises a plurality of chips stacked using through silicon via (TSV).

16. The SIP semiconductor system according to claim 15, wherein a defective TSV is repaired through the rupture operation of the electrical fuse.

17. The SIP semiconductor system according to claim 16, wherein the IEEE standard interface is IEEE 1149.1.

18. A SIP semiconductor system, comprising:
a test access port;
a register configured to be connected to the test access port, and output a rupture start signal and a rupture object fuse information signal during a repair operation; and
a fuse unit configured to rupture a fuse corresponding to the rupture object fuse information signal in response to the rupture start signal and the rupture object fuse information signal.

19. The SIP semiconductor system according to claim 18, wherein values stored in the register comprise a register value for determining whether a rupture operation is to start or has started, a register value in which it is recorded that the rupture operation has ended, and a register value in which information on electrical fuses to be ruptured is recorded.

20. The SIP semiconductor system according to claim 19, wherein the register value for determining whether the rupture operation is to start or has started and the register value in which the information on electrical fuses to be ruptured is recorded are recorded by an input signal through the test access port, and the register value in which it is recorded that the rupture operation has ended is recorded according to whether the rupture operation of the fuse unit has ended.

21. The SIP semiconductor system according to claim 19, further comprising a plurality of memory chips stacked through TSV,
wherein a defective TVS is repaired through the rupture operation for the fuse.

22. The SIP semiconductor system according to claim 19, further comprising a memory device,
wherein a defective storage element of the memory device is repaired through the rupture operation of the fuse.

* * * * *